United States Patent
Aldaz et al.

(10) Patent No.: US 8,679,869 B2
(45) Date of Patent: Mar. 25, 2014

(54) CONTACT FOR A SEMICONDUCTOR LIGHT EMITTING DEVICE

(75) Inventors: Rafael I. Aldaz, Santa Clara, CA (US); John E. Epler, San Jose, CA (US); Patrick N. Grillot, San Jose, CA (US); Michael R. Krames, Los Altos, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 13/423,625

(22) Filed: Mar. 19, 2012

(65) Prior Publication Data
US 2012/0187372 A1   Jul. 26, 2012

Related U.S. Application Data

(62) Division of application No. 11/956,984, filed on Dec. 14, 2007, now abandoned.

(51) Int. Cl.
*H01L 21/00* (2006.01)
(52) U.S. Cl.
USPC ............ 438/26; 438/29; 438/45; 257/98; 257/102
(58) Field of Classification Search
None
See application file for complete search history.

(56) References Cited

U.S. PATENT DOCUMENTS

| | | |
|---|---|---|
| 5,917,202 A | 6/1999 | Haitz et al. |
| 6,228,669 B1 * | 5/2001 | Kondo et al. ............ 438/22 |
| 6,229,160 B1 | 5/2001 | Krames et al. |
| 6,274,924 B1 | 8/2001 | Carey et al. |
| 6,570,190 B2 | 5/2003 | Krames et al. |
| 6,586,875 B1 | 7/2003 | Chen et al. |
| 6,784,463 B2 | 8/2004 | Camras et al. |
| 6,946,309 B2 | 9/2005 | Camras et al. |
| 7,244,630 B2 | 7/2007 | Krames et al. |
| 7,256,483 B2 | 8/2007 | Epler et al. |
| 2001/0028063 A1 * | 10/2001 | Koike et al. ............ 257/94 |
| 2002/0137244 A1 * | 9/2002 | Chen et al. ............ 438/22 |
| 2003/0052326 A1 * | 3/2003 | Ueda et al. ............ 257/101 |
| 2004/0029368 A1 | 2/2004 | Harmon et al. |
| 2004/0227151 A1 | 11/2004 | Konno et al. |
| 2005/0062049 A1 | 3/2005 | Lin et al. |

(Continued)

FOREIGN PATENT DOCUMENTS

| | | |
|---|---|---|
| EP | 1653523 A2 | 3/2006 |
| EP | 1653523 A3 | 3/2006 |

(Continued)

OTHER PUBLICATIONS

International Search Report and Written Opinion PCT/IB2008/055315.

*Primary Examiner* — Andres Munoz

(57) ABSTRACT

An AlGaInP light emitting device is formed as a thin, flip chip device. The device includes a semiconductor structure comprising an AlGaInP light emitting layer disposed between an n-type region and a p-type region. N- and p-contacts electrically connected to the n- and p-type regions are both formed on the same side of the semiconductor structure. The semiconductor structure is connected to a mount via the contacts. A growth substrate is removed from the semiconductor structure and a thick transparent substrate is omitted, such that the total thickness of semiconductor layers in the device is less than 15 µm some embodiments, less than 10 µm in some embodiments. The top side of the semiconductor structure may be textured.

18 Claims, 5 Drawing Sheets

(56) References Cited

U.S. PATENT DOCUMENTS

| | | |
|---|---|---|
| 2005/0224990 A1 | 10/2005 | Venugopalan |
| 2005/0274970 A1 | 12/2005 | Ludowise |
| 2006/0043399 A1 | 3/2006 | Miyagaki et al. |
| 2006/0086942 A1* | 4/2006 | Wu et al. .................. 257/98 |
| 2006/0091409 A1 | 5/2006 | Epler et al. |
| 2007/0096130 A1 | 5/2007 | Schiaffino et al. |
| 2007/0181905 A1* | 8/2007 | Wang et al. ................. 257/103 |
| 2007/0215904 A1 | 9/2007 | Hashimoto |
| 2009/0173956 A1* | 7/2009 | Aldaz et al. .................. 257/94 |

FOREIGN PATENT DOCUMENTS

| | | |
|---|---|---|
| EP | 1705764 A1 | 9/2006 |
| JP | 5315709 A | 11/1993 |
| JP | 7162034 A | 6/1995 |
| JP | 2001044502 A | 2/2001 |
| JP | 2002238486 A | 8/2002 |
| JP | 2003243308 A | 8/2003 |
| JP | 2005101610 A | 4/2005 |
| JP | 2008274214 A | 11/2008 |

* cited by examiner

CONTACT FOR A SEMICONDUCTOR LIGHT EMITTING DEVICE

CROSS-REFERENCE TO RELATED APPLICATIONS

This is a division of U.S. application Ser. No. 11/956,984, filed Dec. 14, 2007, now abandoned by Rafael I. Aldaz et al., titled "Contact for a Semiconductor Light Emitting Device", and incorporated herein by reference.

BACKGROUND

Description of Related Art

Light emitting diodes (LEDs) are widely accepted as light sources in many applications that require low power consumption, small size, and high reliability. Energy-efficient diodes that emit light in the yellow-green to red regions of the visible spectrum contain active layers formed of an AlGaInP alloy. FIGS. 1 and 2 show the fabrication of a conventional transparent substrate (TS) AlGaInP LED, In FIG. 1, an etch stop layer 12, such as a 1000 Å n-$In_{0.5}Ga_{0.5}P$ layer, is grown over a. semiconductor substrate 10, typically GaAs. Device layers 14, including a lower confining layer, at least one $(Al_xGa_{1-x})_yIn_{1-y}P$ active layer, and an upper confining layer, all placed in a double heterostructure configuration, are grown over etch stop layer 12, followed by an optional thick (for example, between 5 and 100 μm thick) window layer 16, often p-type GaP grown by vapor phase epitaxy. The confining layers are made of a transparent semiconductor and enhance the internal quantum efficiency of the LED, defined as the fraction of electron-hole pairs in the active layer that recombine and emit light, The light emitting region may consist of a single thick uniform composition layer or a series of thin wells and barriers.

GaAs is preferred as a growth substrate because it is lattice matched to $(Al_xGa_{1-x})_yIn_{1-y}P$ at compositions favored for the formation of LEDs that emit light in the yellow-green to red regions of the visible spectrum, at y~0.5. Ge is an alternative lattice-matched substrate. Since typical growth substrates are absorbing, they are often removed and replaced by a transparent substrate, as illustrated in FIG. 2. GaAs substrate 10, shown in FIG. 1, is removed by an etch that etches GaAs at a much faster rate than etch stop layer 12. A transparent substrate 18, typically n-type GaP, is wafer bonded to the lower surface of the epitaxial structure (etch stop layer 12 in FIG. 2), generally by annealing the structure at an elevated temperature while uniaxial force is applied. LED chips are then processed from the bonded wafers using conventional metal contacts and chip fabrication techniques suitable for the p-type epitaxial GaP anode and the n-type wafer-bonded GaP cathode.

Transparent substrate 18 and window layer 16, also a transparent semiconductor, spread current laterally in the device and increase the side light emission. Current spreading is particularly important on the p-side of the active region, due to the low mobility of holes in AlGaInP layers. The use of thick semiconductor layers has several disadvantages over other approaches, however, due to the tradeoff between light absorption and electrical and thermal resistivity common in semiconductor materials.

An alternative to a TS AlGaInP device structure is a thin film structure where the semiconductor-semiconductor bonding is eliminated. Instead, a partially processed wafer is bonded to a handle substrate, typically Si, Ge or a metal substrate. After bonding to the handle substrate, the growth substrate is removed and the wafer processing is completed. Such devices often include an absorbing n-contact layer, such as GaAs, and a vertical injection structure where the n- and p-contacts are formed on opposite sides of the semiconductor structure, as in FIG. 2.

SUMMARY

In accordance with embodiments of the invention, an AlGaInP light emitting device is formed as a thin, flip chip device. The device includes a semiconductor structure comprising an AlGaInP light emitting layer disposed between an n-type region and a p-type region. N- and p-contacts electrically connected to the n- and p-type regions are both formed on the same side of the semiconductor structure. In some embodiments, the device includes a thick n-layer, to distribute current laterally, and a thinner p-layer, to conduct current mostly vertically. The semiconductor structure is connected to the mount via the contacts. The growth substrate is removed from the semiconductor structure and the thick transparent substrate described above is omitted, such that the total thickness of semiconductor layers in the device may be less than 15 μm in some embodiments, less than 10 μm in some embodiments. The top side of the semiconductor structure may be textured, roughened, or patterned.

In order to minimize the contact resistance on the p-side of the light emitting layer, the semiconductor structure may include a p-type contact layer disposed between the p-type region and the p-contact. The interface between the p-type contact layer and the p-contact may be configured such that when the device is forward biased, carriers tunnel through the interface. As a result, the contact need not be annealed, which may improve the reflectivity of the contact, as annealing generally causes alloying between the semiconductor material and the metal contact, which often reduces the reflectivity of the contact. In some embodiments, the p-contact layer is one of GaP, AlGaInP, and InGaP, doped at least in portions to a hole concentration of at least $5\times10^{18}$ $cm^{-3}$. The p-contact may be a full sheet of metal, which increases the optical reflectivity, minimizes the electrical contact resistance and decreases the thermal impedance of the device. A tunneling contact may permit the use of a variety of highly reflective metals for the p-contact, such as Ag.

DETAILED DESCRIPTION

Depending on the context, as used herein, "AlGaInP" may refer in particular to a quaternary alloy of aluminum, indium, gallium, and phosphorus, or in general to any binary, ternary, or quaternary alloy of aluminum, indium, gallium, and phosphorus. Depending on the context, as used herein, "contact" may refer in particular to a metal electrode, or in general to the combination of a semiconductor contact layer, a metal electrode, and any structures disposed between the semiconductor contact layer and the metal electrode.

As described above, AlGaInP devices have conventionally included thick layers, particularly on the p-side of the light emitting region, for current spreading, due to the low mobility of holes in p-type AlGaInP material. Thinner p-type layers have generally not been used due to the difficulty of achieving high hole concentrations in AlGaInP.

In accordance with embodiments of the invention, an AlGaInP light emitting device includes a highly doped, thin p-type contact layer. A reflective layer may be formed on the p-type contact layer such that the device may be configured as a thin film flip chip. N-type III-V layers generally have higher carrier mobility than p-type layers, therefore the thickness of the current distribution layer can be reduced by designing the device so most lateral current distribution takes place in an n-type layer, rather than a p-type layer. In such a device, the characteristics of the n-type layer are selected to provide adequate current distribution, to minimize the series resistance of the device, and to minimize absorption losses.

Figure 1:
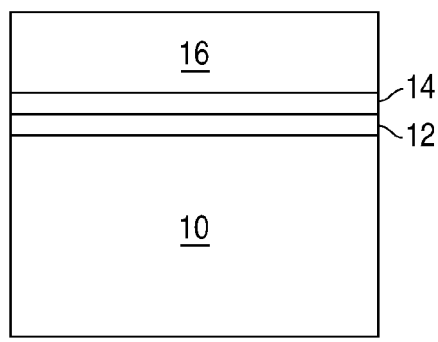
FIG. 1 illustrates a p or a AlGaInP LED device structure grown over an absorbing substrate.
Figure 2:
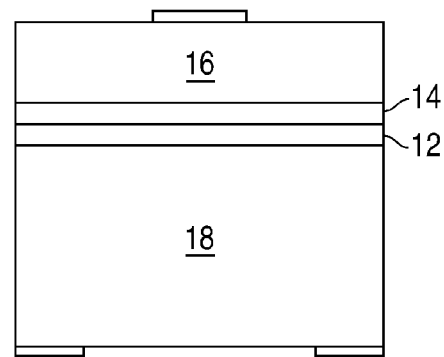
FIG. 2 illustrates a prior art transparent substrate AlGaInP LED.
Figure 3:
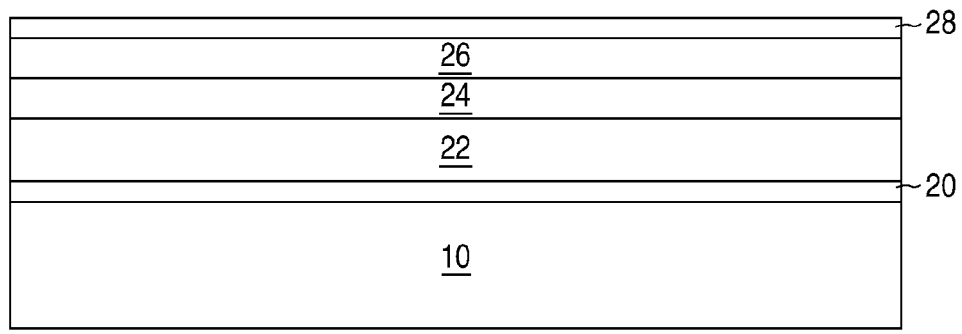
FIG. 3 illustrates the semiconductor structure of a device according to embodiments of the invention.

FIG. 3 illustrates the epitaxial structure of a device according to embodiments of the invention. An etch stop layer 20 is grown over a conventional GaAs substrate 10. Etch stop layer 20 may be any material that may be used to stop an etch used to later remove GaAs substrate 10. Etch stop layer 20 may be, for example, InGaP, AlGaAs, or AlGaInP. The material of etch stop layer 20 may be lattice-matched to the growth substrate (typically GaAs), though it need not be. Etch stop layers that are not lattice matched to the growth substrate may be thin enough to avoid relaxation and/or may be strain compensated. The thickness of etch stop layer 20 depends on the selectivity of the etch solutions used to remove the GaAs substrate 10; the less selective the etch, the thicker the etch stop layer. An AlGaAs etch stop layer may be, for example, between 2000 and 5000 Å, though a thicker etch stop layer may be used if the etch stop layer is used to texture the emitting surface of the device, as described below. The composition x of an $Al_xGa_{1-x}As$ etch stop layer may be, for example, between 0.50 and 0.95.

In some embodiments, multiple etch stop layers are included in the device. Multiple etch stop layers may be separated from each other by GaAs layers, though they need not be. In one example, a first etch stop layer is grown on the GaAs growth substrate, followed by a GaAs layer, followed by a second etch stop layer. The device layers are grown over the second etch stop layer. Any of the etch stop layers described above may be used in a device with multiple etch stop layers. The etch stop layers in a device may each have the properties (such as composition and thickness), though they need not. In a first example, an AlGaAs first etch stop layer is grown over a GaAs substrate, followed by an InGaP second etch stop layer. In a second example, an AlGaAs first etch stop layer is grown over a GaAs substrate, followed by an AlInGaP second etch stop layer.

In one embodiment, an AlGaAs etch stop layer 20 is grown on a GaAs growth substrate 10. An n-type AlGaInP layer, part of n-type region 22, is grown in direct contact with AlGaAs etch stop layer 20.

The device layers, including at least one light emitting layer in a light emitting region sandwiched between an n-type region and a p-type region, are grown over etch stop layer 20, starting with n-type region 22. The thickness and doping concentration of n-type region 22 are selected for low electrical resistance and good current distribution. For example, n-type region 22 may be an AlGaInP layer 4 to 10 μm thick and doped with Te to a concentration of about $1 \times 10^{18}$ cm$^{-3}$. An AlGaInP n-type region 22 is usually lattice-matched to GaAs. At higher dopant concentrations, the same current distribution may be achievable with a thinner layer; however, undesirable free carrier absorption may increase at higher dopant concentrations. N-type region 22 may therefore include a non-uniform doping concentration, such as one or more thick regions doped at $1 \times 10^{18}$ cm$^{-3}$, and one or more thin regions that are doped more heavily, up to, for example, $1 \times 10^{19}$ cm$^{-3}$. These highly doped regions may be doped with Te, Si, S, or other suitable dopants, and the high doping concentration can be achieved either by epitaxial growth, by dopant diffusion, or both.

The composition of n-type region 22 is selected to minimize the step in index of refraction at the interface with the light emitting region, to avoid waveguiding light at that interface. In one example, the composition of n-type region 22 in a device with a light emitting region configured to emit red light is $(Al_{0.40}Ga_{0.60})_{0.5}In_{0.5}P$, approximately the same as the average composition in the light emitting region.

A light emitting or active region 24 is grown over n-type region 22. Examples of suitable light emitting regions include a single light emitting layer, and a multiple well light emitting region, in which multiple thick or thin light emitting wells are separated by barrier layers. In one example, the light emitting region 26 of a device configured to emit red light includes $(Al_{0.06}Ga_{0.94})_{0.5}In_{0.5}P$ light emitting layers separated by $(Al_{0.65}Ga_{0.35})_{0.5}In_{0.5}P$ barriers. The light emitting layers and the barriers may each have a thickness between, for example, 20 and 200 Å. The total thickness of the light emitting region may be, for example, between 500 Å and 3 μm.

A p-type region 26 is grown over light emitting region 24. P-type region 26 is configured to confine carriers in light emitting region 24. In one example, p-type region 26 is $(Al_{0.65}Ga_{0.35})_{0.5}In_{0.5}P$ and includes an extra thin layer of higher Al composition to help in the confinement of electrons. Since current injection from the p-side of light emitting region 24 is mostly vertical, the thickness of p-type region 26 may be on the order of microns; for example, between 0.5 and 3 μm. The proximity of the light emitting layers of the light emitting region to the p-contact through a thin p-type region 26 may also reduce the thermal impedance of the device.

A p-type contact layer 28 is grown over p-type region 26. P-type contact layer 28 is highly doped and transparent to light emitted by the light emitting region 24. For example, p-type contact layer 28 may be doped to a hole concentration of at least $5 \times 10^{18}$ cm$^{-3}$ in some embodiments, and at least $1 \times 10^{19}$ cm$^{-3}$ in some embodiments. P-type contact layer 28 may have a thickness between 100 Å and 1000 Å. in some embodiments, a reflective layer is formed over p-contact layer 28 to form a non-alloyed contact. Electrical contact between p-type contact layer 28 and the reflective layer is achieved by tunneling of carriers through the surface depletion region of the interface.

In some embodiments, p-type contact layer 28 is highly doped GaP. For example, a GaP contact layer 28 grown by metal organic chemical vapor deposition may be doped with Mg or Zn, activated to a hole concentration of at least $8\times10^{18}$ cm$^{-3}$. The GaP layer may be grown at low growth temperature and low growth rate; for example, at growth temperatures approximately 50 to 200° C. below typical GaP growth temperatures of ~850° C., and at growth rates of approximately 1% to 10% of typical GaP growth rates of ~5 μm/hr. A GaP contact grown by molecular beam epitaxy may be doped with C to a concentration of at least $1\times10^{19}$ cm$^{-3}$.

Figure 9:
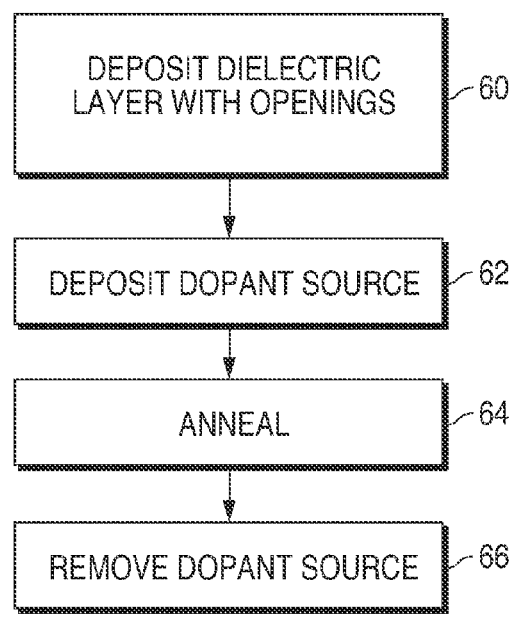
FIG. 9 illustrates a method of doping a semiconductor layer.

As an alternative to incorporating dopants during growth, the p-type contact layer may be grown, then the dopants are diffused into the p-type contact layer from a vapor source after growth, for example by providing a high pressure dopant source in a diffusion furnace or in the growth reactor, as is known in the art. Dopants may be diffused from a vapor source into the entire area of the surface of p-type contact layer 28, or in discrete regions of p-type contact layer 28, for example by masking parts of p-type contact layer 28 with, for example, a dielectric layer, prior to dopant diffusion, In some embodiments, p-type contact layer 28 is a highly doped GaP or lattice-matched AlGaInP layer. The layer is doped as illustrated in FIG. 9 by growing the semiconductor material, then depositing a layer, including a dopant source, over the grown layer, as shown in block 62. For example, the dopant source layer may be elemental Zn, a AuZn alloy, or a doped dielectric layer. The layer including the dopant source may optionally be capped with a diffusion blocking layer. The structure is annealed as shown in block 64 such that the dopants diffuse into the semiconductor from the dopant source layer. The diffusion blocking layer and remaining dopant source layer are then stripped off as shown in block 66. In one example, 3000 Å to 5000 Å of a AuZn alloy containing 4% Zn is deposited over a GaP layer, followed by a TiW diffusion blocking layer. The structure is heated, then the remaining TiW and AuZn are stripped. In some embodiments, an optional dielectric layer with openings is formed on the semiconductor layer, as shown in block 60, before depositing the dopant source.

In some embodiments, p-type contact layer 28 is highly doped InGaP or AlGaInP layer that is not lattice-matched to GaAs. The layer may be between 100 Å and 300 Å thick and doped with Mg or Zn to a hole concentration of at least $1\times10^{19}$ cm$^{-3}$.

Figure 4:
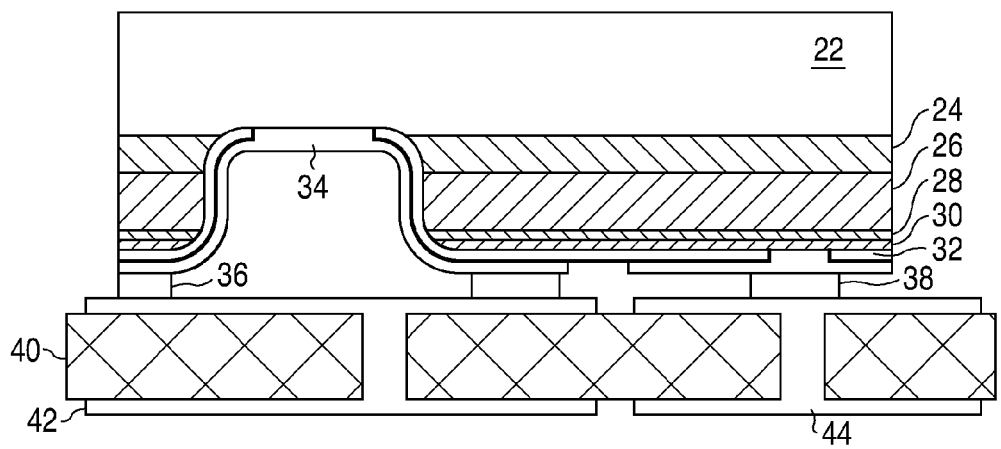
FIG. 4 illustrates a flip chip device according to embodiments of the invention.
Figure 8:
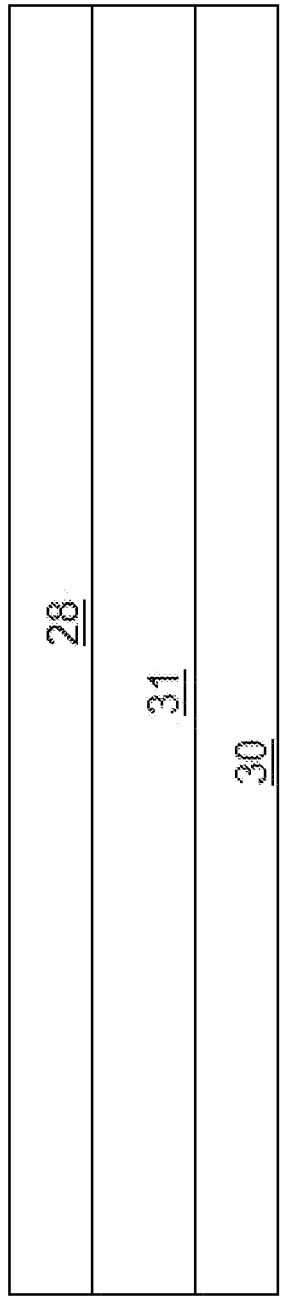
FIG. 8 illustrates a non-metal conductive material disposed between a portion of a p-type contact layer and a portion of a reflective metal.

FIG. 4 illustrates the epitaxial structure of FIG. 3 processed into a thin film chip device. A reflective metal 30 such as Ag is formed over p-type contact layer 28. In conventional devices, a contact metal is deposited on the semiconductor, then annealed at a high temperature (for example, at a temperature greater than 500° C.) to improve the contact. The anneal can decrease the reflectivity of the metal, possibly by causing intermixing of the metal and the semiconductor. In the device illustrated in FIG. 4, since contact between at least a portion of p-type contact layer 28 and reflective metal 30 is achieved by tunneling, the contact is referred to as anon-alloyed contact, and a high temperature anneal is not necessary. A low temperature anneal (for example, at a temperature less than 300° c.) may improve the tunneling contact by gettering impurities or improving the bond between the metal contact and the semiconductor contact layer.

in some embodiments, a non-metal conductive material 31 such as indium tin oxide (ITO) or ZnO is disposed between at least a portion of p-type contact layer 28 and reflective metal 30 as illustrated in FIG. 8.

Figure 6:
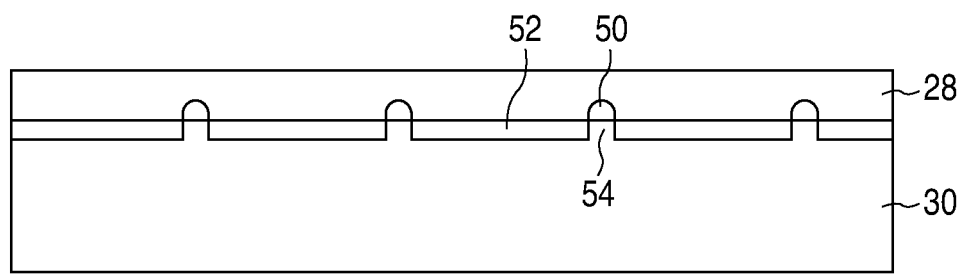
FIG. 6 illustrates a portion of a contact and p-type contact layer with highly doped semiconductor dots and a dielectric layer disposed between parts of the p-contact and the p-type contact layer.

In some embodiments, a combination of small contact regions and a dielectric mirror may be disposed between p-contact layer 28 and reflective metal 30, as illustrated in FIG. 6, which shows a portion of p-type contact layer 28 and reflective metal 30. For example, small dots of an alloyed metal such as AuZn might be patterned on p-contact layer 28, surrounded by a non-conductive oxide 52 such as Al$_2$O$_3$. The structure is annealed to diffuse the AuZn dopants into the semiconductor to form highly doped semiconductor dots 50, then the remaining AuZn metal is stripped off. A reflective metal 30 such as Ag is formed over the dielectric 52 and highly doped semiconductor dots 50. In this example, the small areas 54 exposed to the diffusion of AuZn provide the electrical contact, and the larger percentage of the area covered by the dielectric 52/reflective metal 30 provides a highly reflective surface. P-type layer 26 (shown in FIG. 3) might be between 1 μm to 3 μm thick to provide good enough lateral current distribution from the highly doped semiconductor dots 50 (shown in FIG. 6). In the contact design illustrated in FIG. 6, since optical absorption from the AuZn diffused areas is minimized, the contact has suitably good reflectivity from the dielectric/metal areas.

Highly doped semiconductor dots 50 in FIG. 6 may also be formed by growing p-type contact layer 28, forming dielectric areas 52 with openings 54, then diffusing dopants into p-type contact layer 28 from a. vapor source on in openings 54, as described above.

Figure 7:
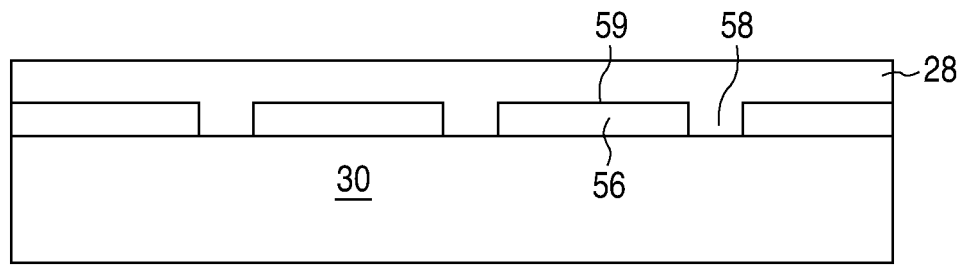
FIG. 7 illustrates a portion of a p-contact and a p-type contact layer where portions of the p-type contact layer are etched away.

In some embodiments, portions of p--type contact layer 28 are removed, for example by etching, as illustrated in FIG. 7. A highly doped layer such as p-type contact layer 28 is generally somewhat absorbing. To reduce absorption, areas 59 of absorbing material at the surface of p-type contact layer 28 may be etched away. The entire thickness of p-type contact layer 28 may be etched away at areas 59, or some thickness of p-type contact layer 28 may remain, as illustrated in FIG. 7. The remaining portions 58 of p-type contact layer 28 make electrical contact with p-contact 30, for example by a tunneling contact as described herein. P-contact 30 may directly contact the surface of the p-type material at areas 59, or an optional dielectric material 56 may be disposed between p-type contact layer 28 and p-contact 30 in the areas 59 where part of the p-type contact layer 28 is etched away.

Returning to FIG. 4, one or more vias are etched in the device, for example, by dry etching, to expose a portion of n-type region 22 on which n-contact 34 is formed. Direct electrical contact between n-type region 22 and n-contact 34 may be achieved by, for example, a Au/Ge n-contact 34. Alternatively, n-contact 34 may be a tunneling, non-alloyed reflective contact such as Al deposited on a highly doped region of n-type layer 22. N- and p-contacts 34 and 30 may be electrically isolated, redistributed and planarized by one or more dielectric layers 32. A wafer of devices is then diced, An individual device is then connected to mount 40 by p- and n-interconnects 38 and 36. Contacts 42 and 44 may be formed on the backside of mount 40.

In some embodiments, to obviate the need to use an underfill between the mount and the LED die to support the die, n- and p-contacts 34 and 30 may be formed in substantially the same plane, and may cover at least 85% of the back surface of the LED structure. The mount has a corresponding layout of anode and cathode contacts substantially in the same plane. The LED die contacts and mount contacts are interconnected together such that virtually the entire surface of the LED die is supported by the contacts and submount. No underfill is necessary. Different methods for LED to submount interconnection can be used, such as ultrasonic or thermosonic metal-to-metal interdiffusion (gold-gold, copper-copper, other ductile metals, or a combination of the above), or soldering with different alloy compositions such as gold-tin, gold-germanium, tin-silver, tin-lead, or other similar alloy systems. Suitable interconnects are described in more detail in US Published Patent Application 20070096130, titled "LED Assembly Having Maximum Metal Support for Laser Lift-Off of Growth Substrate," and incorporated herein by reference, After connecting the device to mount 40, growth substrate 10 is removed, for example by an etch that terminates on etch stop layer 20. Etch stop layer 20 may be removed by a dry etch or an etch that terminates on n-type region 22. The exposed surface of n-type region 22 may be textured (i.e. roughened or patterned with, for example, a photonic crystal) to improve light extraction. For example, n-type region 22 may be roughened by dry etching, photochemical etching, or photoelectrochemical etching. Alternatively, etch stop layer 20 may be textured, then the pattern transferred to n-type region 22 by dry etching. In some embodiments, an additional transparent conductive oxide layer is deposited on the textured surface of n-type region 22 to improve current distribution in the device.

The total thickness of the remaining semiconductor material in the finished device may be less than 15 μm in some embodiments, less than 10 μm in some embodiments. In one example, n-type region 22 is 4 to 6 μm thick, light emitting region 24 is 1.5 μm thick, and p-type region 26 is 1.5 μm thick, for a total thickness of 7 to 9 μm.

In some embodiments, all the semiconductor layers (except the light emitting layers) in the finished device, in particular the n-type layer on which the n-contact is formed, have a band gap larger than the band gap of the light emitting layers of the light emitting region, Accordingly, in such embodiments, no semiconductor layers in the device other than the light emitting layers directly absorb the light emitted by the light emitting region.

The embodiments described herein may offer several advantages over conventional TS AlGaInP devices. For example, the extraction efficiency of embodiments of the invention may approach that of thick-window TS AlGaInP devices with shaped sidewalls, but enhanced surface emission from a thin-film device may result in better directionality and higher surface brightness. In addition, the embodiments described herein allow for simpler growth structures, inexpensive fabrication, and potentially better heat extraction from the active region. Growth problems common in conventional TS AlGaInP devices, such as diffusion of p-dopants during the growth of GaP windows by VPE, may be avoided by the embodiments described herein.

The embodiments describe herein may offer several advantages over other thin film devices. For example, in some of the above embodiments, no wafer-level bonding, neither semiconductor-semiconductor wafer-level bonding nor wafer-level bonding to a handle substrate, is required. Wafer-level bonding can damage the semiconductor structure by imparting stress due to thermal expansion mismatch between the bonded structures or layers. Also, a wafer-level bond may be damaged by subsequent processing steps. The above embodiments may also simplify manufacturing because they do not require simulation of a structure bonded to a handle substrate. Further, the above embodiments eliminate problems associated with a vertical injection structure, such as optical occlusion of the light emitting region, fragile wire bonds, and structural interference with close optics.

Figure 5:
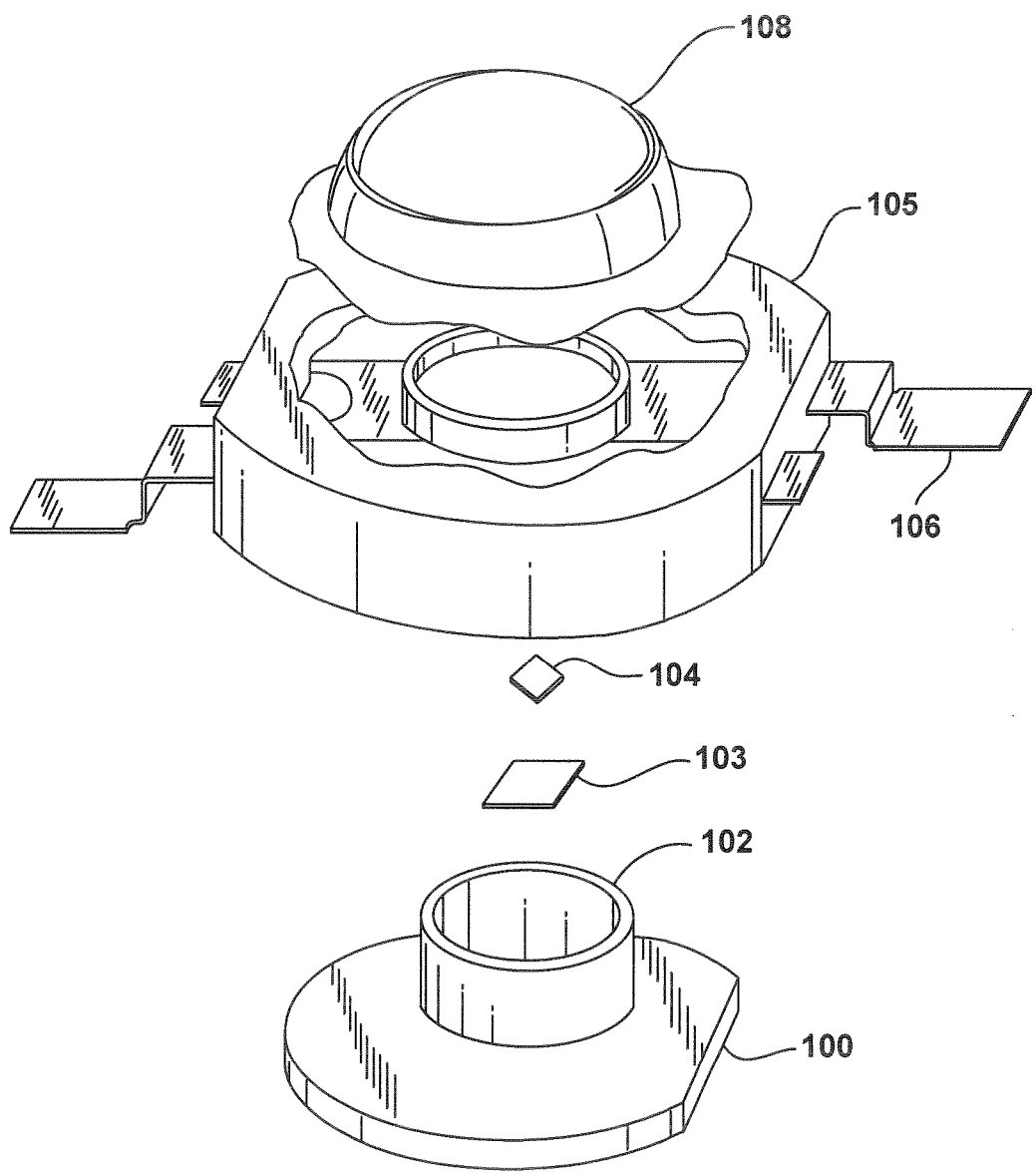
FIG. 5 is an exploded view of a packaged light emitting device.

FIG. 5 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A method comprising:
   growing a semiconductor structure comprising an AlGaInP light emitting layer disposed between an n-type region and a p-type region over a growth substrate;
   forming an n-contact electrically connected to the n-type region and a p-contact electrically connected to a p-type contact layer in the p-type region, wherein the n- and p-contacts are both disposed on a same side of the semiconductor structure and wherein at least one of the n- and p-contacts is reflective;
   disposing a plurality of alloyed regions and a dielectric layer between the p-type contact layer and the p-contact;
   connecting the semiconductor structure to a mount; and
   after connecting the semiconductor structure to the mount, removing the growth substrate.

2. The method of claim 1 wherein removing the growth substrate comprises etching the growth substrate with an etch that terminates on an etch stop layer disposed between the semiconductor structure and the growth substrate.

3. The method of claim 2 wherein the etch stop layer is one of AlGaAs, InGaP, and AlGaInP.

4. The method of claim 2 wherein:
   the etch stop layer is AlGaAs; and
   a portion of the semiconductor structure in direct contact with the etch stop layer is AlGaInP.

5. The method of claim 1 wherein the n- and p-contacts are formed prior to connecting the semiconductor structure to the mount.

6. The method of claim 1 wherein:
   the n-contact comprises Au and Ge; and
   the n-contact is in direct contact with an n-type semiconductor layer.

7. The method of claim 1 wherein growing the semiconductor structure comprises growing a semiconductor wafer, the method further comprising dicing the semiconductor wafer into individual semiconductor structures prior to connecting the semiconductor structure to the mount.

8. The method of claim 1 wherein the p-contact is reflective and comprises Ag.

9. A method comprising:
   growing a semiconductor structure comprising an AlGaInP light emitting layer disposed between an n-type region and a p-type region over a growth substrate;
   forming an n-contact electrically connected to the n-type region and a metal p-contact electrically connected to and in direct contact with a p-type contact layer in the p-type region, wherein the n- and metal p-contacts are both disposed on a same side of the semiconductor structure and wherein at least one of the n- and metal p-contacts is reflective;
   connecting the semiconductor structure to a mount;
   after connecting the semiconductor structure to the mount, removing the growth substrate;
   etching away portions of the p-type contact layer prior to forming the metal p-contact; and disposing a dielectric between the metal p-contact and the p-type region in at least one region corresponding to an etched-away portion of the p-type contact layer.

10. The method of claim 9 wherein at least a portion of the p-type contact layer is doped to a hole concentration of at least $5\times10^{18}$ cm$^{-3}$.

11. The method of claim 10 wherein p-type dopants are introduced into the p-type contact layer by one of introduction during growth of the p-type contact layer and diffusion from a vapor source after growth of a contact layer.

12. The method of claim 10 wherein portions of the p-type contact layer doped to a hole concentration of at least $5\times10^{18}$ cm$^{-3}$ are aligned with openings in the dielectric layer.

13. The method of claim 10 wherein growing the semiconductor structure comprises growing the p-type contact layer by metal organic chemical vapor deposition at a growth rate less than 5000 Å per hour.

14. The method of claim 10 wherein the p-type contact layer is one of GaP, AlGaInP, and InGaP.

15. The method of claim 9 wherein the metal p-contact comprises Ag.

16. A method comprising:
    growing a semiconductor structure comprising an AlGaInP light emitting layer disposed between an n-type region and a p-type region over a growth substrate;
    growing a contact layer in the p-type region;
    depositing a layer comprising a dopant over the contact layer, wherein the layer comprising a dopant is one of metal and dielectric;
    annealing the semiconductor structure to form a p-type contact layer;
    removing the layer comprising a dopant;
    forming an n-contact electrically connected to the n-type region and a p-contact electrically connected to the p-type contact layer in the p-type region, wherein the n- and p-contacts are both disposed on a same side of the semiconductor structure and wherein at least one of the n- and p-contacts is reflective;
    connecting the semiconductor structure to a mount; and
    after connecting the semiconductor structure to the mount, removing the growth substrate.

17. The method of claim 16 further comprising depositing a dielectric layer with openings over the p-type contact layer, prior to depositing the layer comprising a the dopant.

18. The method of claim 16 wherein the p-contact comprises Ag.

* * * * *